US006824325B2

(12) United States Patent
Gundlach et al.

(10) Patent No.: US 6,824,325 B2
(45) Date of Patent: Nov. 30, 2004

(54) APPARATUS AND SYSTEM TO ATTACH A MEMBER

(75) Inventors: John Geoffrey Gundlach, Durham, NC (US); Jerry Lee Gunter, Raleigh, NC (US); Dean Frederick Herring, Youngsville, NC (US); Glenn Edward Myrto, Holly Springs, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/252,657

(22) Filed: Sep. 23, 2002

(65) Prior Publication Data

US 2004/0057788 A1 Mar. 25, 2004

(51) Int. Cl.[7] ................................................. H05K 7/16
(52) U.S. Cl. ...................... 403/329; 403/326; 403/327; 403/321; 403/325; 403/315; 403/316; 403/317; 361/724; 361/725; 361/726
(58) Field of Search ................................. 403/321, 325, 403/326, 327, 329, 13, 14, 315–317; 312/319.1, 265.1, 223.1, 223.2; 361/724–727; 211/26; 24/545, 457, 458

(56) References Cited

U.S. PATENT DOCUMENTS

| 3,266,209 | A |   | 8/1966  | Zibell |
|---|---|---|---|---|
| 3,677,589 | A |   | 7/1972  | Roles |
| 3,749,432 | A |   | 7/1973  | Janssen |
| 3,791,096 | A | * | 2/1974  | Epperlein ................... 403/315 |
| 3,892,054 | A |   | 7/1975  | Matson |
| 4,663,911 | A |   | 5/1987  | Gracia |
| 4,937,994 | A |   | 7/1990  | Ritter |
| 5,657,604 | A |   | 8/1997  | Malott |
| 5,833,337 | A | * | 11/1998 | Kofstad ................... 312/334.5 |
| 6,666,340 | B2 | * | 12/2003 | Basinger et al. ............. 211/26 |

OTHER PUBLICATIONS

US 2003/0168414 A1 Sep. 2003 Lauchner et al.*

* cited by examiner

*Primary Examiner*—Daniel P. Stodola
*Assistant Examiner*—Michael P. Ferguson
(74) *Attorney, Agent, or Firm*—Lally & Lally, LLP

(57) ABSTRACT

A system and apparatus to couple a bracket member with a receiver member is disclosed. Embodiments may couple bracket members with receiver members, such as brackets to rails of racks, via a flexible member. The flexible member may secure a bracket member to a receiver member by fastening the bracket member to a corresponding extension or tab of the receiver member. Some embodiments may load a second portion of the flexible member such that pressure applied to the second portion can transfer the load to a first portion of the flexible member to facilitate coupling the bracket member with or decoupling the bracket member from the receiver member. In many of these embodiments, the load may transfer as a waveform along the flexible member. Further embodiments provide a lever for the second portion of the flexible member to facilitate transferring a load to the first portion.

16 Claims, 5 Drawing Sheets

APPARATUS AND SYSTEM TO ATTACH A MEMBER

FIELD OF INVENTION

The present invention is in the field of attachment hardware and more particularly, the present invention provides an apparatus and system to couple a bracket member to a receiver member, such as a bracket for mounting a server to a rail of a server rack or the like.

BACKGROUND

Computers and data storage devices are housed in standardized equipment enclosures. These enclosures may have an outer, aesthetically pleasing housing that is supported by an inner rack. The rack is a substantially rectilinear metal frame including several vertical columns and rails, each provided with a plurality of mounting and alignment appendages, such as tabs and extensions to mount various devices in the rack.

Brackets attach to the rails, for example, to secure servers or other devices. The brackets have openings to hook extensions protruding from the rail, as well as features to attach the brackets to the servers. After attaching the brackets to the servers, the brackets are fastened to the rails with screws, thumbscrews, or bolts.

Attaching brackets to rails of a server, or other types of bracket members to receiver members, with screws, thumbscrews, or bolts is not only cumbersome and time-consuming, but also inefficient with regards to space utility. For instance, assembling a server rack and mounting servers can include attaching a couple dozen brackets to rails with a couple dozen or more screws or bolts. Each bracket is positioned on a rail and tediously screwed or bolted to the rail. Further, upon attaching the brackets to the rails, the screw heads or bolt heads and nuts consume or inhibit the use of potentially useable space of the server rack. In some of these situations, the screws or bolts can require more space than is available to attach the server to a rail so either a server having different dimensions is mounted in the rack or the space remains unutilized.

SUMMARY OF THE INVENTION

The problems identified above are in large part addressed by a system and apparatus for coupling bracket members with receiver members, such as brackets to rails of server racks, via a flexible member. The flexible member may secure a bracket member to a receiver member by fastening the bracket member to a corresponding extension or tab of the receiver member. Some embodiments may load a second portion of the flexible member such that pressure applied to the second portion can transfer the load to a first portion of the flexible member to facilitate coupling the bracket member with or decoupling the bracket member from the receiver member. In many of these embodiments, the load may transfer as a waveform along the flexible member. Further embodiments provide a lever for the second portion of the flexible member to facilitate transferring a load to the first portion.

BRIEF DESCRIPTION OF THE DRAWINGS

Other objects and advantages of the invention will become apparent upon reading the following detailed description and upon reference to the accompanying drawings in which, like references may indicate similar elements:

FIG. 1A depicts a close-up view of the embodiment of the system of FIG. 1

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, an apparatus and method for coupling a bracket member with a receiver member are disclosed. In various embodiments, the invention may include or employ a flexible member to secure a bracket member to a corresponding extension or tab of a receiver member. Embodiments may also include features to adapt to different extension configurations such as extensions having different sizes, shapes and/or orientations. Some embodiments load one portion of a flat, flexible member. In many of these embodiments, pressure applied to the loaded portion, or second portion, causes the load to be applied to or transferred to a first portion of the flexible member to facilitate coupling the bracket member with or decoupling the bracket member from the receiver member. The load may transfer as a waveform along the flexible member between the second portion and the first portion.

While the load is stored in the first portion of the flexible member, the load may be stable or unstable. In particular, when the load on the first portion is unstable, the load will return to the second portion of the flexible member after the pressure is removed. On the other hand, when the load is stable in the first portion of the flexible member, the load will remain stored in the first portion until pressure, or the like, is applied to the first portion. Several embodiments adjust or set to the stable states or shapes of the flexible member by coupling end points of the flexible member in different ways such as pivotally coupling an endpoint or fixedly coupling an endpoint between, for instance, zero and ninety degrees with respect to the plane of the bracket member. Other implementations may adjust or set the stability points by adjusting the resiliency of the first and/or second portion of the flexible member such as by adjusting a size of an opening of the first and/or second portions. Further embodiments provide a lever for the second portion of the flexible member to facilitate transferring a load to the first portion of the flexible member.

Figure 1:
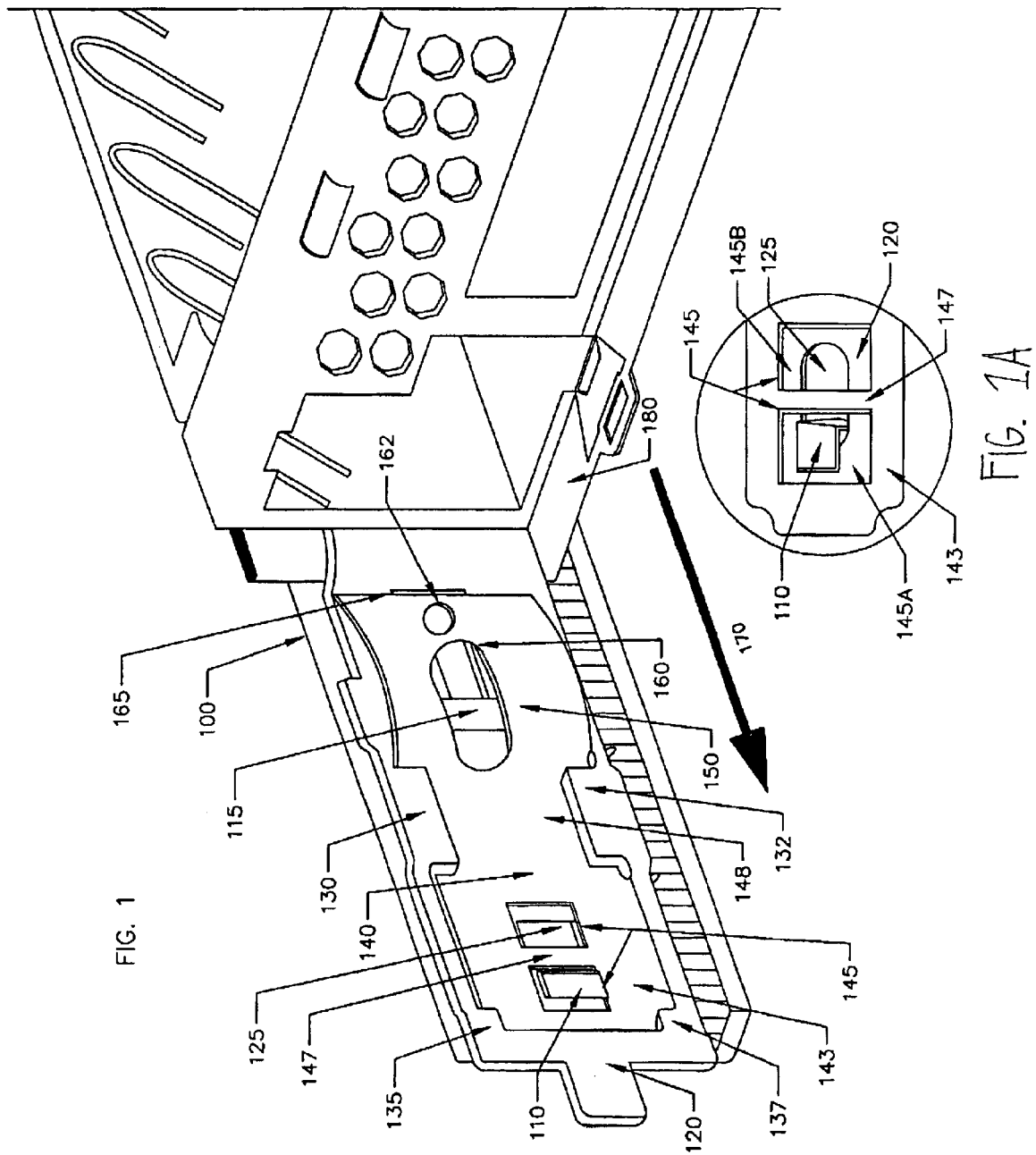
FIG. 1 depicts an embodiment of a system comprising a bracket member coupled with a server rack in a first state, wherein a flexible member maintains the coupling between the bracket member and the receiver member.

Turning now to the drawings, FIG. 1 depicts an embodiment of a system comprising a receiver member 100, a bracket member 120, and a flexible member 140. Bracket member 120 is coupled with receiver member 100, such as a server rack, in a first state. Flexible member 140 maintains the coupling between bracket member 120 and receiver member 100 by fastening bracket member 120 to an extension 110. Receiver member 100 comprises extensions 110 and 115 to couple with bracket member 120. In some embodiments, extensions 110 and 115 may limit movement of bracket member 120 to a single direction, such as direction 170. In the depicted embodiment, extensions 110 and 115 comprise L-shaped extensions having openings facing direction 170. Bracket member 120 is seated on receiver member 100 such that extensions 110 and 115 protrude through openings of bracket member 120, such as opening 125. Bracket member 120 is slid toward server 180 to couple bracket member 120 between the upper portions of extensions 110 and 115 and receiver member 100.

After, for example, extension 110 couples with opening 125 of bracket member 120 to limit movement of bracket member 120, flexible member 140 couples with opening 125 to reduce a dimension of opening 125. In particular, extension 110 includes an upper portion having a larger dimension than the corresponding dimension of a lower portion of extension 110. Flexible member 140 may reduce the corresponding dimension of opening 125 to accommodate the lower portion of extension 110, but not the upper portion, by covering a portion of opening 125. As a result, bracket member 120 is prevented from sliding far enough in direction 170 to release extension 110 and bracket member 120 is securely fastened to receiver member 100. In further embodiments, the upper portion of extension 110 may comprise a larger cross-sectional area than the lower portion or may be oriented differently from the lower portion. In some embodiments, the lower portion of extension 110 may comprise a notch configured to couple with opening 125 of bracket member 120 or to couple with flexible member 140.

Bracket member 120 may comprise openings such as opening 125 to receive one or more extensions, such as extensions 110 and 115, and lips such as lips 130, 132, 135, 137, and 165 to couple with flexible member 140. In other embodiments, flexible member 140 may couple with receiver member 100. Lips 135 and 137 may couple with flexible member 140 to hold or clamp an end of a first portion 143 of flexible member 140 at a position substantially fixed with respect to opening 125 of bracket member 120. In particular, lips 135 and 137 are adapted to hold the end of first portion 143 flat against bracket member 120. In other embodiments, lips 135 and 137 may clamp the end of first portion 143 at an angle such as an angle between zero and ninety degrees with respect to the plane of bracket member 120. Clamping the first end of flexible member 140 can set a stable or default position for the flexible member. For example, when lips 135 and 137 clamp the end of first portion 143 at zero degrees (or flat) with respect to bracket member 120, first portion 143 will resist bending to an angle, storing potential energy to return first portion 143 to zero degrees with respect to bracket member 120. In such embodiments, the state of flexible member 140 may be stable while the first portion is at zero degrees with respect to bracket member 120.

Lips 130 and 132 may couple a middle portion 148 of flexible member 140 with bracket member 120. In other embodiments, an extension or lip of receiver member 100 may couple with the middle portion 148. Lips 130 and 132 may provide a sliding constraint for flexible member 140 to limit movement of middle portion 148 in a direction perpendicular to the plane of receiver member 100. For instance, second portion 150 of flexible member 140 may transfer a load to first portion 143 in the form of a standing wave. The peak of the standing wave in first portion 143 as a result of the transfer is above or nearly above opening 125 of bracket member 120. The placement of the peak of the wave in first portion 143 is based upon the position of the first end of first portion 143 and the position of the sliding constraint for the middle portion 148.

Lip 165 includes a pivotal coupling for second portion 150. In other embodiments, second portion 150 may be coupled with bracket member 120 at a fixed or substantially fixed angle with lips such as lips 135 and 137. Lip 165 pivotally couples with an end of second portion 150 to facilitate more than one stable position or shape for second portion 150. In further embodiments, the end of first portion 143 of flexible member 140 may also pivotally couple with bracket member 120 to facilitate more than one stable state or shape for flexible member 140. In several of these embodiments, openings of flexible member 140 may be configured to adjust the resiliency of first portion 143 and/or second portion 150 to determine one or more stable states for flexible member 140. For example, a dimension of an opening of second portion 150 may be increased to reduce the resiliency of second portion 150. Reducing the resiliency of second portion 150 may increase the stability associated with retaining a load in first portion 143.

Flexible member 140 may advantageously facilitate tool-less fastening for the bracket member 120 to receiver member 100. In some embodiments, flexible member 140 may provide low profile coupling for the bracket member 120 and receiver member 100. In some of these embodiments, screws, thumb screws and bolts are not viable alternatives because they protrude out from the bracket and/or receiver member too far, interfering with other features or devices associated with receiver member 100 and bracket member 120.

As indicated previously, flexible member 140 includes first portion 143, middle portion 148, and second portion 150. First portion 143 has an opening 145 coupled with bracket member 120 to cover a portion of opening 125, the remaining portion of opening 125 having a dimension smaller than the dimension of the upper portion of extension 110. In particular, when first portion 143 lays substantially flat against bracket member 120, portion 147 of first portion 143 blocks or covers a portion of the useable space of opening 125 such that the upper portion of extension 110 may no longer fit through the remaining portion of opening 125.

In some embodiments, first portion 143 comprises more than one opening to accommodate more than one configuration of extensions. For example, extension 110 may, on a different receiver member 100 or in a different location of receiver member 100, protrude through the opening 145B rather than opening 145A. In some embodiments, the upper portion of extension 110 may extend in a direction opposite of direction 170. For example, bracket member 120 may slide in direction 170 to receive and couple with extensions of receiver member 100. One extension may protrude through opening 125 within opening 145B of flexible member 140. Portion 147 may cover a portion of opening 125, securing bracket member 120 to receiver member 100. In further embodiments, the openings 145 may comprise notches rather than holes.

The flexible member middle portion 148 is situated between first portion 143 and second portion 150. In some embodiments, middle portion 148 may couple with bracket member 120 at a substantially fixed position with respect to receiver member 100 via lips 130 and 132 to limit movement of the middle portion 148 in a direction corresponding to the amplitude of the wave to transfer between first portion 143 and second portion 150, such as a direction perpendicular to the plane of the receiver member 100. A direction perpendicular to the plane of receiver member 100 may comprise, for instance, a direction away from or toward receiver member 100. Limiting the movement of the middle portion 148 in a direction perpendicular to the plane of the receiver member 100 can substantially fix a trough of the wave formed in flexible member 140, wherein the wave may form as a result of pressure applied to second portion 150. Substantially fixing the position of the trough may also substantially fix the position of a peak of the waveform above opening 125 of bracket member 120. Thus, first portion 143 may bend in accordance with the waveform with a peak above opening 125, uncovering bracket member 120 to facilitate inserting extension 110 through opening 125 and/or moving bracket member 120 to withdrawal extension 110 from opening 125.

In other embodiments, middle portion 148 may comprise an angled portion to determine a trough for the wave. In some of these embodiments, the angled portion may direct the trough toward receiver member 100 so a bracket member without lips 130 and 132 may limit movement of middle portion 148. In further embodiments, the amplitude of the wave may reside in a plane parallel to the plane of receiver member 100. In these embodiments, middle portion 148 may couple with bracket member 120 to restrict movement of middle portion 148 in a direction parallel to the plane of receiver member 100.

Second portion 150 may apply a load to first portion 143 in response to an application of pressure to second portion 150. The load may bend first portion 143 based upon limited movement of ends of first portion 143, wherein bending first portion 143 uncovers the portion of opening 125 of bracket member 120 covered by portion 147 of first portion 143. In the present embodiment, a trigger load may be applied to second portion 150 to couple an end of second portion 150 with bracket member 120. Since second portion 150 is pivotally coupled with bracket member 120, the state of second portion 150 may be stable while storing the trigger load. The load applied to second portion 150 advantageously acts as a trigger to change the state of flexible member 140 with an application of pressure to second portion 150. In such embodiments, the pressure applied to second portion 150 may be less than the load to apply to first portion 143, bending first portion 143 based upon the load or potential energy stored in second portion 150.

In several embodiments, second portion 150 may comprise one or more openings such as opening 160. Opening 160 may receive extension 115 when pressure is applied to second portion 150 and second portion 150 is pressed substantially flat against bracket 120. In one embodiment, opening 160 may not cover or block a portion of the corresponding opening of bracket member 120 so opening 160 may not interfere in coupling bracket member 120 with or decoupling bracket member 120 from receiver member 100 via extension 115. For instance, opening 160 may be as large as or larger than the corresponding opening of bracket member 120.

Second portion 150 may also comprise openings 160 and/or 162 to adjust the resiliency of the second portion 150 of flexible member 140. Adjusting the resiliency of second portion 150 may adjust stability of the retention of load by second portion 150 and first portion 143. For instance, flexible member 140 may be stable in the state or shape shown in FIG. 1. Stability in this position facilitates locking or securing bracket member 120 to receiver member 100. On the other hand, flexible member may also be stable, in some embodiments, in the state shown in FIG. 2 wherein first portion 143 is bent to facilitate coupling bracket member 120 with and decoupling bracket member 120 from receiver member 100.

In further embodiments, second portion 150 may be a longer portion of flexible member 140 than first portion 143. The lengths of first portion 143 and second portion 150 may be determined by the location of lips 130 and 132 along bracket member 120 since the ends of flexible member 140 are a substantially fixed distance apart. When second portion 150 is longer than first portion 143, for instance, the wave formed by second portion 150 as a result of the trigger load is lower in amplitude than the corresponding wave after transferring the load to first portion 143. Thus, the pressure to actuate a transfer of the load from second portion 150 may be less than the pressure to actuate a transfer of the load from first portion 143 to second portion 150, advantageously providing a more secure coupling between bracket member 120 and receiver member 100.

Figure 2:
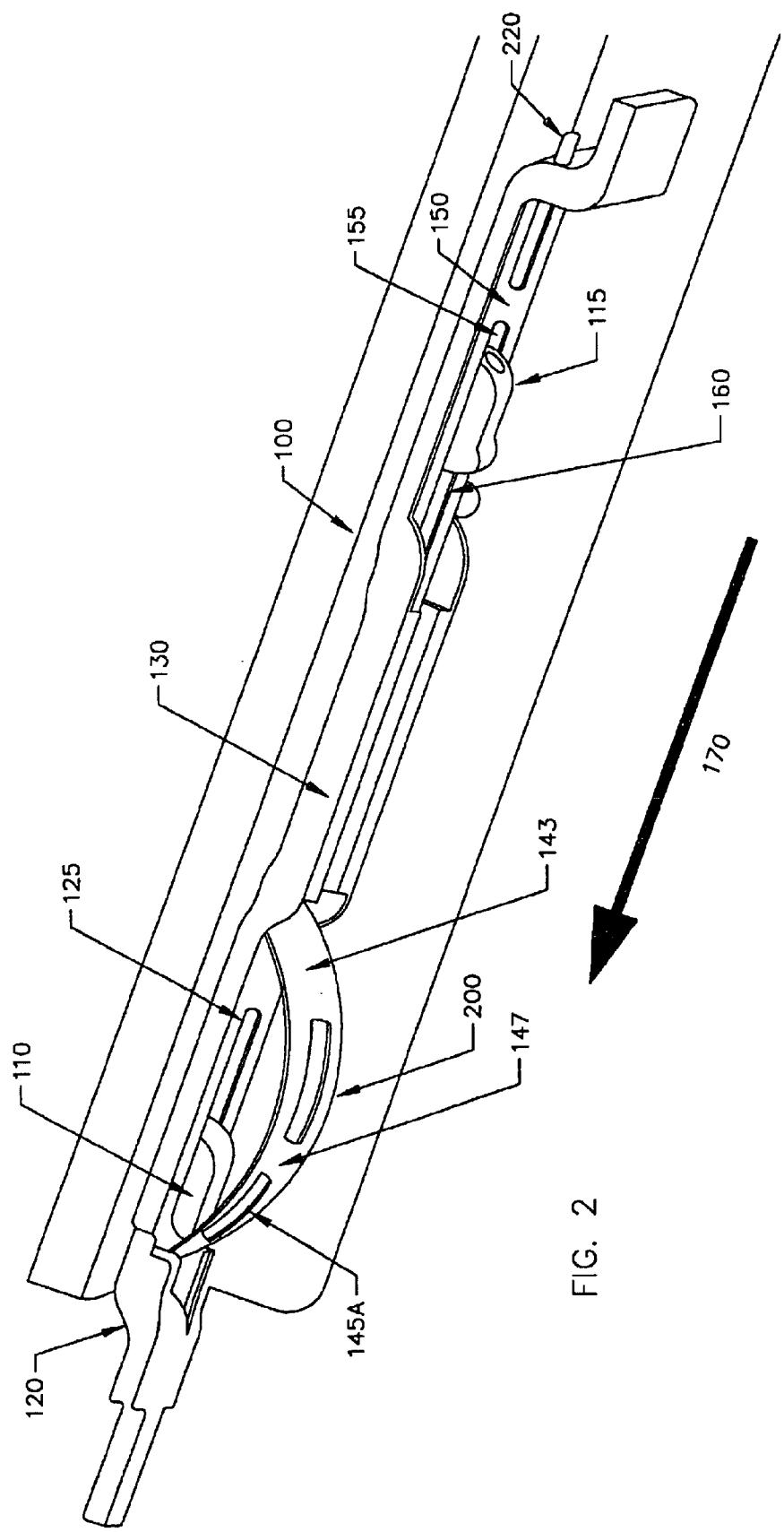
FIG. 2 depicts the embodiment of the system of FIG. 1 in a second state to facilitate removal of the bracket member from the receiver member.

Referring now to FIG. 2, there is shown the embodiment of the system of FIG. 1 in a second state to facilitate decoupling bracket member 120 from or coupling bracket member 120 with receiver member 100. First portion 143 comprises a load received from second portion 150 in the form of a standing wave 200 along flexible member 140.

In this second state, first portion 143 is bent to decouple opening 145A from extension 110 and portion 147 from opening 125. After portion 147 is decoupled from opening 125, bracket member 120 may slide in direction 170, sliding extension 110 along opening 125 in a direction opposite of direction 170. Then bracket member 120 may be removed from receiver member 100. On the other hand, while flexible member is in the second state, bracket member 120 may also be coupled with receiver member 100. Extension 110 may be inserted through opening 125 and bracket member 120 may slide in a direction opposite of direction 170 to couple extension 110 with bracket member 120. Extension 115 may couple with bracket member 120 in a similar manner.

In some embodiments, flexible member 140 may advantageously be stable in the second state as depicted. In particular, flexible member 140 may be configured to be stable in the second state to facilitate quick attachment of bracket members like bracket member 120 to receiver members like receiver member 100. In such embodiments, pressure applied to standing wave 200 can expeditiously cause the state to change, transferring the load back to second portion 150, as shown in FIG. 1.

Figure 2A:
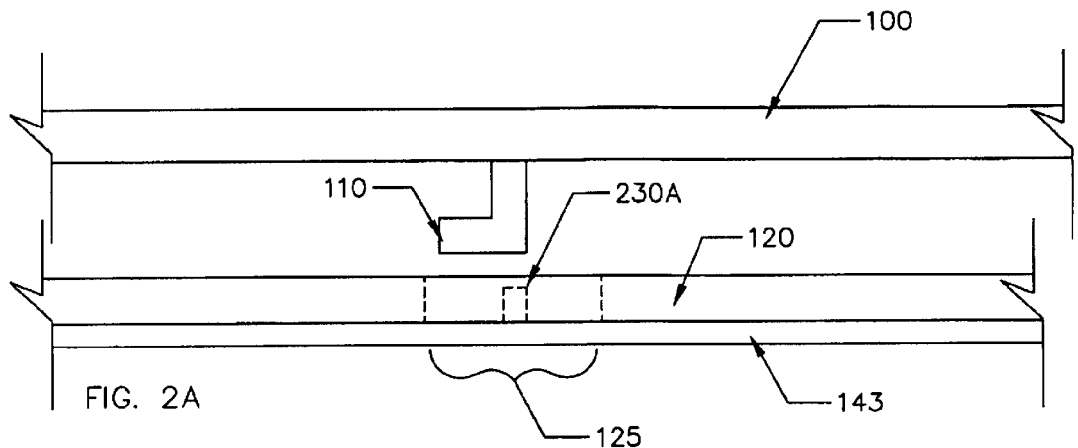
FIGS. 2A-C depict an alternative embodiment of the system of FIG. 1 wherein the flexible member comprises a pin to couple the bracket member to the receiver member.
Figure 2B:
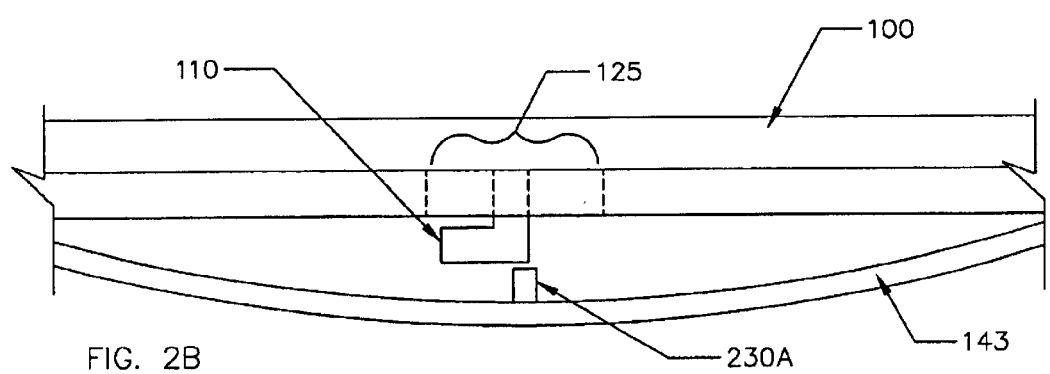
Figure 2C:
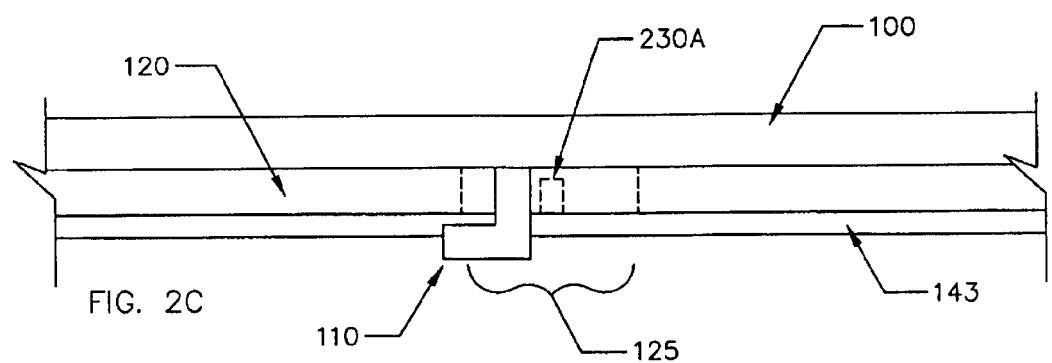

In further embodiments, first portion 143 may comprise a member such as pin 230A depicted in FIGS. 2A, 2B, and 2C. Pressure may be applied to the bottom of first portion 143 to transfer the load from second portion 150 to first portion 143 via pin 230A. Pin 230A can be designed to extend into opening 125 of bracket member 120 when first portion 143 is flat or substantially flat against bracket member 120 and to advantageously apply pressure outward from receiver member 100 and bracket member 120 when bracket member 120 is coupled with receiver member 100. Applying pressure outward from receiver member 100 may cause the load of the second portion 150 to transfer to first portion 143, transferring the load from second portion 150 to first portion 143 as bracket member 120 is coupled with receiver member 100 to facilitate installation of bracket member 120 onto receiver member 100 without application of pressure to second portion 150. For example, FIG. 2A depicts bracket member 120 and first portion 143 of flexible member 140 prior to attaching bracket member 120 to receiver member 100. First portion 143 is flat against bracket member 120 and the load is stored in second portion 150 (as depicted in FIG. 1). As bracket member 120 is pressed against receiver member 100, pressing extension 110 through opening 125, as depicted in FIG. 2B, extension 110 applies outward pressure to pin 230A of first portion 143, transferring the load or part of the load from second portion 150 (as depicted in FIG. 2) to first portion 143. After extension 110 is seated with bracket member 120, load may transfer from first portion 143 to second portion 150 to securely fasten bracket member 120 with receiver member 100, as depicted in FIG. 2C.

After applying the load to first portion 143, second portion 150 becomes substantially flat. When the second portion is substantially flat, opening 160 of second portion 150 can receive extension 115 of receiver member 100 since second portion 150 may not cover or block the opening 155 of bracket member 120. Further, extension 115 may be removed while second portion 150 remains substantially flat.

In other embodiments, second portion 150 may remain bent after applying the load to first portion 143. In many of these embodiments, second portion 150 may be longer than first portion 143 such that less pressure is applied to second portion 150 to transfer sufficient load to first portion 143 to release extension 110, and in some embodiments, more pressure is to be applied to first portion 143 to transfer load back to second portion 150. In further embodiments, second portion 150 may remain sufficiently bent or maintain sufficient load to avoid interference with extension 115 while coupling bracket member 120 to or decoupling bracket member 120 from receiver member 100.

Second portion 150 is pivotally coupled with bracket member 120. In the present embodiment, flexible member 140 is pivotally coupled with bracket member 120 by inserting tab 220 through a lip of bracket member 120. Thus, the coupling between tab 220 and bracket member 120 may provide little or no resistance to changing from one state to another state, such as changing between the states depicted in FIGS. 1 and 2. In other embodiments, second portion 150 may be coupled at an angle with bracket member 120 to return second portion 150 to a stable state wherein flexible member 140 secures bracket member 120 to receiver member 100.

Figure 3:
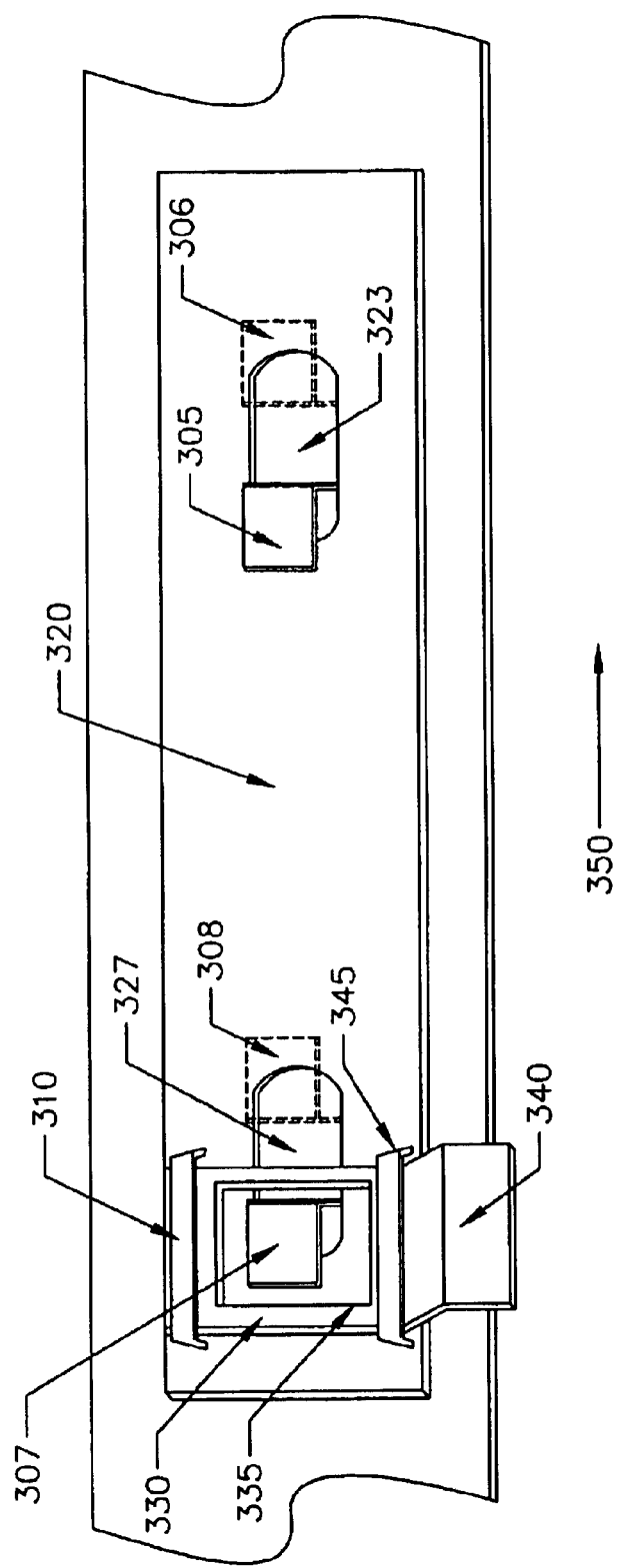
FIG. 3 depicts an embodiment of an apparatus to secure a bracket to a receiver member, wherein the flexible member couples with the receiver member.

FIG. 3 depicts an embodiment of an apparatus to secure a bracket member 320 to a receiver member 300, wherein the flexible member 330 couples with the receiver member 300. The embodiment comprises receiver member 300, bracket member 320, and flexible member 330. Receiver member 300 may comprise a portion of a shelving unit such as a bookshelf, a rail to mount equipment in a home entertainment center, framing for a shelving unit, or the like. The framing, for instance, may be assembled quickly with tool-less mounting hardware implementing an embodiment of the present invention rather than by screws or bolts. Receiver member 300 may comprise extensions 305 and 307 to couple with bracket member 320. In other embodiments, receiver member 300 may comprise extensions such as extensions 306 and 308.

Bracket member 320 may comprise, for example, an attachment feature of another framing support to attach to receiver member 300. Bracket member 320 comprises two openings, opening 323 and opening 327. Openings 323 and 327 receive extensions 305 and 307 respectively. Then, lever 340, the second portion of flexible member 330, may be pressed to bend flexible member 330 in an arch having a peak 430, depicted in FIG. 4. Peak 430 may be located above extension 307 to facilitate securing bracket member 320 to receiver member 300. In other embodiments wherein receiver member 300 may comprise a different extension configuration, such as extensions 306 and 308, flexible member 330 may similarly couple with opening 327 to substantially fix the position of bracket member 320 with respect to extension 308. In further embodiments, flexible member 330 may be adapted to couple with opening 323.

In some embodiments, bracket member 320 may comprise lips or openings to couple with flexible member 330. For example, lip 310 couples the end of the first portion of flexible member 330 with bracket member 320 to substantially fix an end of flexible member 330 to facilitate transference of load from lever 340 to the first portion as a waveform. Lip 310 and lip 345 may provide support to maintain the position of bracket member 320 with respect to extension 307 or extension 308. An advantage of fastening bracket member 320 to receiver member 300 with an embodiment such as the embodiment in FIG. 3 is that extensions 305 and 307, or 306 and 308, can support bracket member 320 while lips 310 and 345 assure that the bracket remains fastened to the extensions of receiver member 300.

Flexible member 330 may couple bracket member 320 with receiver member 300 via extension 307 of receiver member 300. Flexible member 330 may comprise a first portion having an end coupled with lip 310 at a substantially fixed position with respect to opening 327 of bracket member 320. The first portion of flexible member 330 may also have opening 335 to receive extension 307 via opening 327 of bracket member 320. An edge of opening 335 may cover a portion of opening 327, wherein a dimension of the remaining portion of opening 327 is smaller than a dimension of extension 307. After extension 307 is received by opening 327, the edge of opening 335 may cover the portion of opening 327 to fasten bracket member 320 to extension 307. In some embodiments, flexible member 330 comprises substantially flat, flexible material such as spring steel, plastic or rubber composite, or the like.

Figure 4:
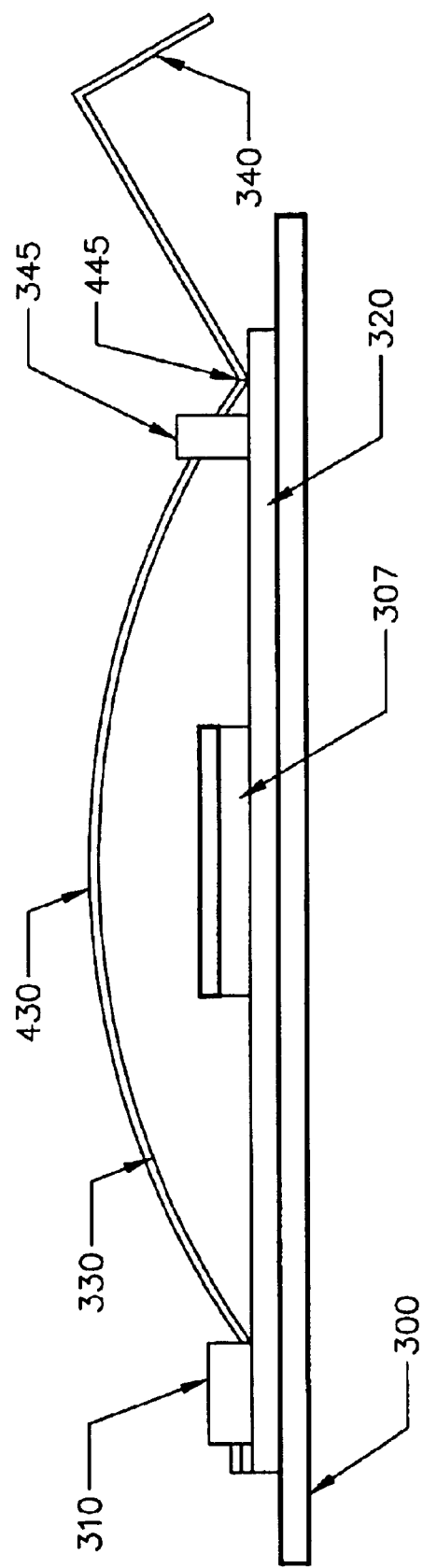
FIG. 4 depicts the embodiment of the apparatus of FIG. 3 as viewed from the left end.

FIG. 4 illustrates the embodiment of FIG. 3 in a side view. As depicted in FIG. 4, flexible member 330 further comprises lever 340 as a second portion. Lever 340 can be pressed to apply a load to the first portion of flexible member 330. More specifically, when pressure is applied to lever 340, middle portion 445 of flexible member 330 couples with bracket member 320 to transfer the load resulting from the pressure to the first portion of flexible member 330.

Middle portion 445, or the angled portion of flexible member 330, couples with bracket member 320 at a substantially fixed position with respect to receiver member 300 based upon the position of the angled portion along the length of flexible member 330. Middle portion 445 may contact the base of bracket member 320 or, in some embodiments, the base of receiver member 300 to limit movement of middle portion 445 in a direction perpendicular to the plane of receiver member 300 to facilitate bending the first portion of flexible member 330 in response to an application of the load from lever 340. The application of the load from lever 340 may be in the form of a wave, bending the first portion of flexible member 330 to uncover or unblock the portion of opening 327 of bracket member 320 covered by flexible member 330. Thus, the first portion of flexible member 330 may arc above extension 307 to facilitate sliding bracket member 320 onto or off of receiver member 300.

It will be apparent to those skilled in the art having the benefit of this disclosure that the present invention contemplates improved hardware to fasten or secure a bracket member to a receiver member via a flexible member, wherein the securing hardware may advantageously be tool-less, and, in some embodiments, low-profile. It is understood that the form of the invention shown and described in the detailed description and the drawings are to be taken merely as presently preferred examples. It is intended that the following claims be interpreted broadly to embrace all the variations of the preferred embodiments disclosed

What is claimed is:

1. A flexible member to couple a bracket member with a receiver member, wherein an extension of the receiver member protrudes through an opening of the bracket member, the flexible member comprising:
   a first portion having an end to be coupled at a substantially fixed position with respect to the opening to align the first portion to cover a portion of the opening, wherein a dimension of the remaining portion of the opening is to be smaller than a dimension of the extension to block withdrawal of the extension through the opening;
   a second portion to apply a load to the first portion in response to pressure applied to the second portion; and
   a middle portion between the first portion and the second portion, to be coupled at a position with respect to the receiver member to limit movement of the middle portion to bend the first portion in response to an application of the load, wherein bending the first portion uncovers the portion of the opening;
   wherein the second portion is longer than the first portion to transfer the load from the second portion to the first portion in response to the pressure, wherein the pressure is less than a pressure to transfer the load from the first portion to the second portion.

2. The flexible member of claim 1, wherein the first portion comprises substantially flat, spring steel.

3. The flexible member of claim 1, wherein the end of the first portion is configured to be coupled between the bracket member and a lip of the bracket member.

4. The flexible member of claim 1, wherein the second portion comprises an end configured to be coupled with the bracket member at a position substantially fixed with respect to the substantially fixed position of the end of the first portion, wherein a distance between the positions of the ends along a plane of the bracket member is shorter than a length of the flexible member between the ends.

5. The flexible member of claim 1, wherein the middle portion is configured to couple between the bracket member and a lip of the bracket member at the position with respect to the receiver member to limit movement of the middle portion in a direction perpendicular to a plane of the receiver member to transfer the load between the first portion and the second portion as a waveform, wherein an amplitude of the waveform is associated with a distance of the flexible member from the bracket member in the direction.

6. An apparatus, comprising:
   a bracket member to couple with a receiver member, having an opening to receive an extension of the receiver member, wherein a dimension of an upper portion of the extension is larger than a corresponding dimension of a lower portion of the extension; and
   a flexible member having a first portion aligned to cover a portion of the opening, the dimension of the upper portion being larger than a corresponding dimension of a remainder of the opening, having a second portion to apply a load to the first portion in response to pressure applied to the second portion, and having a middle portion between the first portion and the second portion, coupled with the bracket member to bend the first portion in response to an application of the load, wherein bending the first portion uncovers the portion of the opening and further wherein the second portion comprises an opening to store the load in the first portion until pressure is applied to the first portion.

7. The apparatus of claim 6, wherein the bracket member comprises a lip to couple with an end of the first portion to substantially fix the location of the end with respect to the opening of the bracket member.

8. The apparatus of claim 6, wherein the bracket member comprises a lip to couple with the middle portion to limit movement of the middle portion of the flexible member in a direction perpendicular to a plane of the receiver member to transfer the load between the first portion and the second portion as a waveform, the waveform having an amplitude based upon a distance of the flexible member from the bracket member in the direction.

9. The apparatus of claim 8, wherein the lip is slidably coupled with the flexible member to determine the second portion is longer than the first portion to transfer the load from the second portion to the first portion with the pressure, wherein the pressure is less than a pressure to transfer the load from the first portion to the second portion.

10. The apparatus of claim 6, wherein the bracket member comprises more than one opening to couple with more than one extension of the receiver member.

11. The claim apparatus of claim 6, wherein the flexible member comprises an opening to receive the extension of the receiver member via the opening of the bracket member.

12. A system, comprising:
   a receiver member having an extension, wherein a dimension of an upper portion of the extension is larger than a corresponding dimension of a lower portion of the extension;
   a bracket member coupled with the receiver member and having an opening, the upper portion of the extension protruding through the opening; and
   a flexible member having a first portion to cover a portion of the opening to block withdrawal of the upper portion via the opening, having a second portion to apply a load to the first portion in response to an application of pressure to the second portion, and having a middle portion between the first portion and the second portion, coupled with the bracket member to limit movement of the middle portion to bend the first portion in response to an application of the load based upon limited movement of the ends of the first portion and the second portion, wherein bending the first portion uncovers the portion of the opening of the bracket member;
   wherein the flexible member comprises substantially flat, resilient material, coupled with the bracket member to transfer the load between the first portion and the second portion as a waveform.

13. The system of claim 12, wherein the extension comprises an L-shaped extension to couple the bracket member between the upper portion of the L-shaped extension and the receiver member.

14. The system of claim 12, wherein the flexible member comprises more than one opening to accommodate different extension configurations.

15. The system of claim 12, wherein the second portion comprises a longer portion of the flexible member than the first portion, the longer portion being associated with a lower amplitude of the waveform than an amplitude of the waveform associated with storage of the load in the first portion.

16. The system of claim 12, wherein the second portion comprises an opening configured to store the load in the first portion until pressure is applied to the first portion.

* * * * *